(12) United States Patent
Hsieh et al.

(10) Patent No.: US 11,488,870 B2
(45) Date of Patent: Nov. 1, 2022

(54) SEMICONDUCTOR DEVICE AND METHOD FOR FABRICATING THE SAME

(71) Applicant: UNITED MICROELECTRONICS CORP., Hsin-Chu (TW)

(72) Inventors: Tien-Yu Hsieh, Taichung (TW); Kuan-Ti Wang, Kaohsiung (TW); Han-Chen Chen, Kaohsiung (TW); Kun-Hsien Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 31 days.

(21) Appl. No.: 16/843,880

(22) Filed: Apr. 8, 2020

(65) Prior Publication Data
US 2021/0287942 A1 Sep. 16, 2021

(30) Foreign Application Priority Data
Mar. 10, 2020 (TW) .................. 109107840

(51) Int. Cl.
| | |
|---|---|
| *H01L 21/8234* | (2006.01) |
| *H01L 29/66* | (2006.01) |
| *H01L 27/088* | (2006.01) |
| *H01L 21/28* | (2006.01) |
| *H01L 21/3213* | (2006.01) |
| *H01L 21/311* | (2006.01) |
| *H01L 21/321* | (2006.01) |
| *H01L 29/49* | (2006.01) |
| *H01L 21/3105* | (2006.01) |

(52) U.S. Cl.
CPC .. *H01L 21/82345* (2013.01); *H01L 21/28088* (2013.01); *H01L 21/31053* (2013.01); *H01L 21/31144* (2013.01); *H01L 21/3212* (2013.01); *H01L 21/32133* (2013.01); *H01L 21/823456* (2013.01); *H01L 27/088* (2013.01); *H01L 29/4966* (2013.01); *H01L 29/66545* (2013.01)

(58) Field of Classification Search
CPC ........ H01L 21/82345; H01L 21/28088; H01L 21/31053; H01L 21/21144; H01L 21/3212; H01L 23/528; H01L 21/311; H01L 27/108
See application file for complete search history.

(56) References Cited

U.S. PATENT DOCUMENTS

| | | | |
|---|---|---|---|
| 2007/0290250 A1 | 12/2007 | Clark, Jr. et al. | |
| 2016/0336315 A1* | 11/2016 | You .................. | H01L 29/785 |
| 2020/0043939 A1* | 2/2020 | Wu et al. .......... | H01L 29/785 |
| 2020/0083114 A1* | 3/2020 | Chen ................ | H01L 21/823821 |

* cited by examiner

*Primary Examiner* — Monica D Harrison
*Assistant Examiner* — Andre C Stevenson
(74) *Attorney, Agent, or Firm* — Winston Hsu

(57) ABSTRACT

A method for fabricating semiconductor device includes the steps of: providing a substrate having a first region, a second region, and a third region; forming a first gate structure on the first region, a second gate structure on the second region, and a third gate structure on the third region; forming an interlayer dielectric (ILD) layer around the first gate structure, the second gate structure, and the third gate structure; removing the first gate structure, the second gate structure, and the third gate structure to form a first recess, a second recess, and a third recess; forming a first interfacial layer in the first recess, the second recess, and the third recess; removing the first interfacial layer in the second recess; and forming a second interfacial layer in the second recess.

15 Claims, 9 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of forming interfacial layers having different thicknesses.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistors, device regions such as input/output region and core region are largely affected by the predetermined thickness of interfacial layer. For instance, thicker interfacial layer in input/output region easily lowers the operation speed of the device while thinner interfacial layer in core region often results in severe leakage. Hence, how to resolve this issue has become an important task in this field.

SUMMARY OF THE INVENTION

According to an embodiment of the present invention, a method for fabricating semiconductor device includes the steps of: providing a substrate having a first region, a second region, and a third region; forming a first gate structure on the first region, a second gate structure on the second region, and a third gate structure on the third region; forming an interlayer dielectric (ILD) layer around the first gate structure, the second gate structure, and the third gate structure; removing the first gate structure, the second gate structure, and the third gate structure to form a first recess, a second recess, and a third recess; forming a first interfacial layer in the first recess, the second recess, and the third recess; removing the first interfacial layer in the second recess; and forming a second interfacial layer in the second recess.

According to another aspect of the present invention, a semiconductor device includes: a substrate having a first region, a second region, and a third region; a first metal gate on the first region and a second metal gate on the second region. Preferably, the first metal gate includes a first interfacial layer and a first work function metal (WFM) layer on the first interfacial layer. The second metal gate includes the first interfacial layer, a second interfacial layer on the first interfacial layer, and a second WFM layer on the second interfacial layer, in which the first WFM layer and the second WFM layer have different work functions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
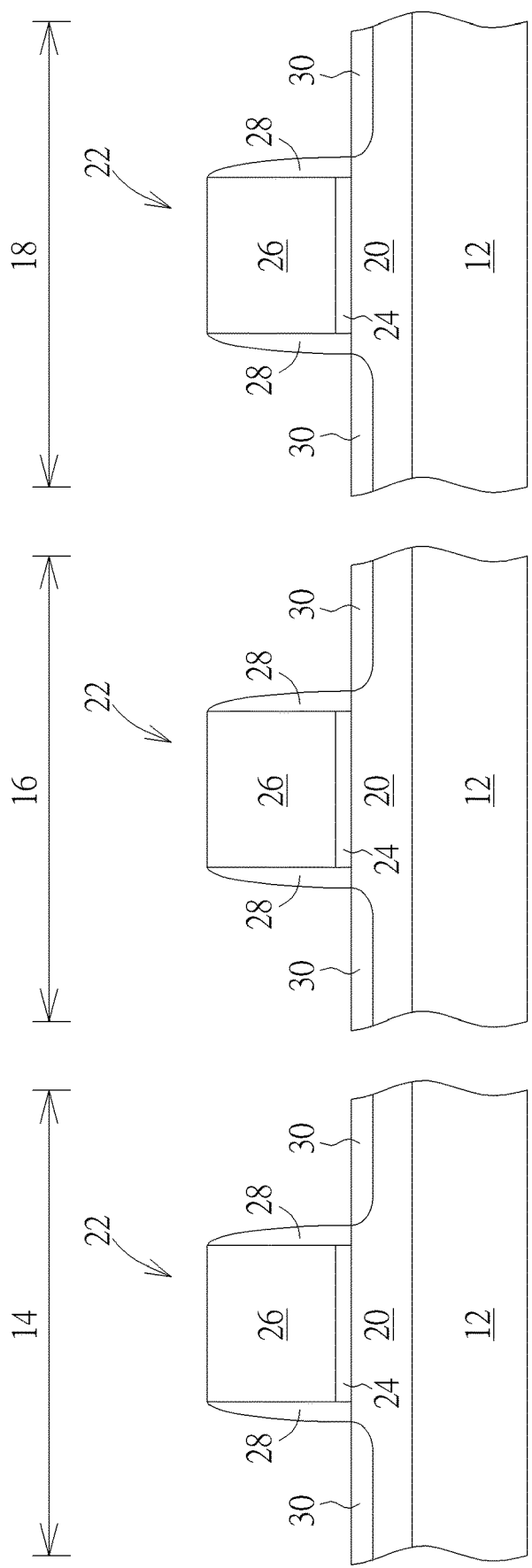
FIGS. 1-8 illustrate a method for fabricating a semiconductor device according to an embodiment of the present invention.

Referring to FIGS. 1-8, FIGS. 1-8 illustrate a method for fabricating a semiconductor device according to an embodiment of the present invention. As shown in FIG. 1, a substrate 12, such as a silicon substrate or silicon-on-insulator (SOI) substrate is provided, and three or more transistor regions, such as regions 14, 16, 18 are defined on the substrate 12. In this embodiment, the three regions 14, 16, 18 are transistor regions sharing same conductive type, such as all being PMOS regions or NMOS regions. Preferably, the three regions 14, 16, 18 are defined to fabricate gate structures having different threshold voltages in the later process. Specifically, the region 14 includes an input/output region, the region 16 includes a middle gate region, and the region 18 includes a core region. In this embodiment, at least a fin-shaped structure 20 is formed on each of the transistor regions 14, 16, 18, and the bottom of the fin-shaped structure 20 is surrounded by a shallow trench isolation (STI) (not shown) composed of silicon oxide. It should be noted that even though this embodiment pertains to a FinFET process, it would also be desirable to apply the process of this embodiment to a non-planar MOS transistor, which is also within the scope of the present invention.

The fin-shaped structure 20 of this embodiment is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 20 of this embodiment could also be obtained by first forming a patterned mask (not shown) on the substrate, 12, and through an etching process, the pattern of the patterned mask is transferred to the substrate 12 to form the fin-shaped structure 20. Moreover, the formation of the fin-shaped structure 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 20. These approaches for forming fin-shaped structure 20 are all within the scope of the present invention.

Next, gate structures or dummy gates 22 are formed on the substrate 12. In this embodiment, the formation of the dummy gates 22 could be accomplished by sequentially depositing a gate dielectric layer, a gate material layer, and a selective hard mask on the substrate 12, conducting a pattern transfer process by using a patterned resist (not shown) as mask to remove part of the gate material layer and part of the gate dielectric layer, and then stripping the patterned resist to form dummy gates 22 or gate structures on the fin-shaped structure 20 on regions 14, 16, 18. Each of the dummy gates 22 preferably includes a patterned gate dielectric layer 24 and a patterned material layer 26, in which the gate dielectric layer 24 includes silicon oxide and the gate material layer 26 includes polysilicon, but not limited thereto.

Next, at least a spacer 28 is formed on sidewalls of each dummy gate 22, a source/drain region 30 and/or epitaxial layer (not shown) is formed in the fin-shaped structure 20 and/or substrate 12 adjacent to two sides of the spacer 28, and a selective silicide (not shown) is formed on the surface of the source/drain region 30 and/or epitaxial layer. In this embodiment, the spacer 28 could be a single spacer or a composite spacer. For instance, the spacer 28 could further include an offset spacer (not shown) and a main spacer (not shown), and the spacer 28 could be selected from the group consisting of $SiO_2$, SiN, SiON, and SiCN. The source/drain region 30 and epitaxial layer could include different dopants or different material depending on the type of transistor being fabricated. For instance, the source/drain region 30 could include p-type or n-type dopants and the epitaxial layer could include SiGe, SiC, or SiP.

Figure 2:
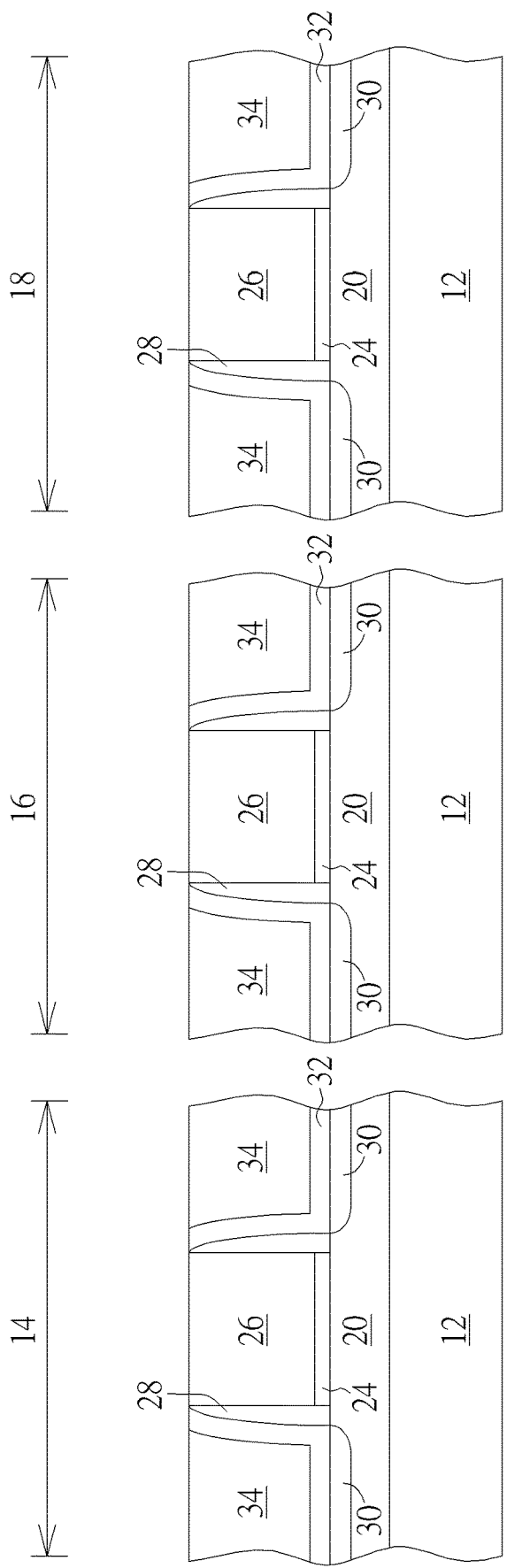

Next, as shown in FIG. 2, a contact etch stop layer (CESL) 32 composed of silicon nitride could be selectively formed on the substrate 12 to cover the dummy gates 22, and an interlayer dielectric layer 34 is formed on the CESL 32. Next, a planarizing process, such as chemical mechanical polishing (CMP) process is conducted to remove part of the ILD layer 34 and part of the CESL 32 to expose the gate material layer 26 composed of polysilicon, in which the top surface of the gate material layer 26 on each of the regions 14, 16, 18 and the top surface of the ILD layer 34 are coplanar.

Figure 3:
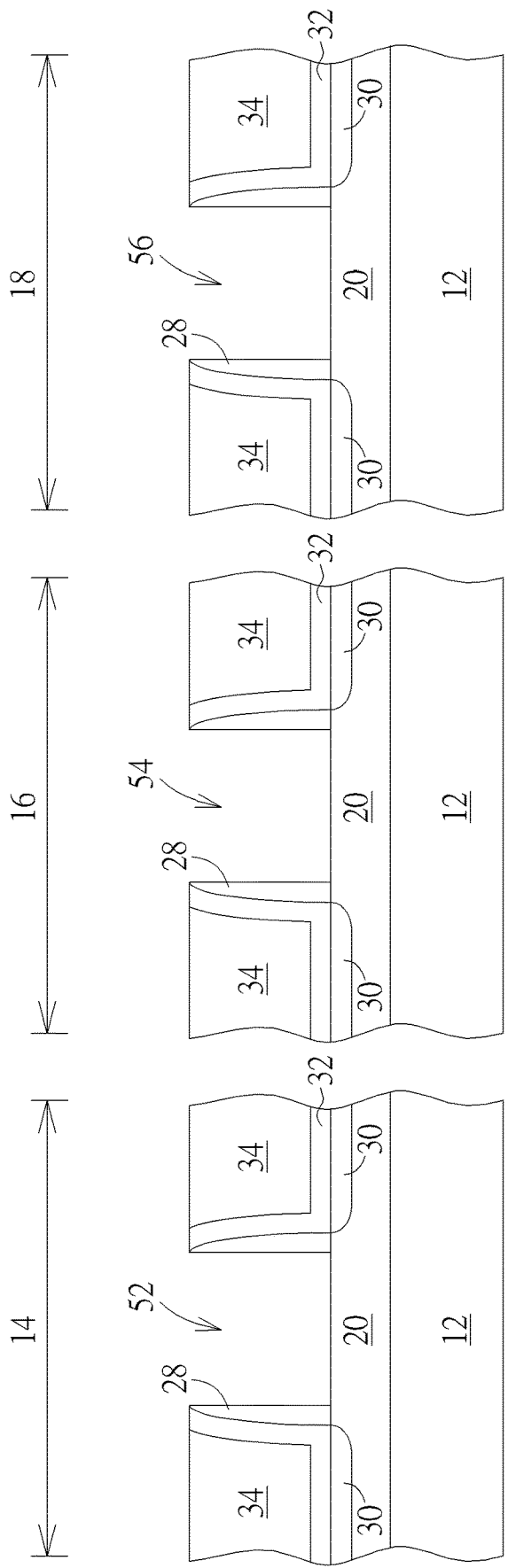

Next, a replacement metal gate (RMG) process is conducted to transform the dummy gates 22 into metal gates. For instance, as shown in FIG. 3, a selective dry etching or wet etching process could be conducted by using etchant including ammonium hydroxide ($NH_4OH$) or tetramethylammonium hydroxide (TMAH) to remove the dummy gates 22 or the gate material layer 26 in the gate structures for forming recesses 52, 54, 56 in the ILD layer 34.

Figure 4:
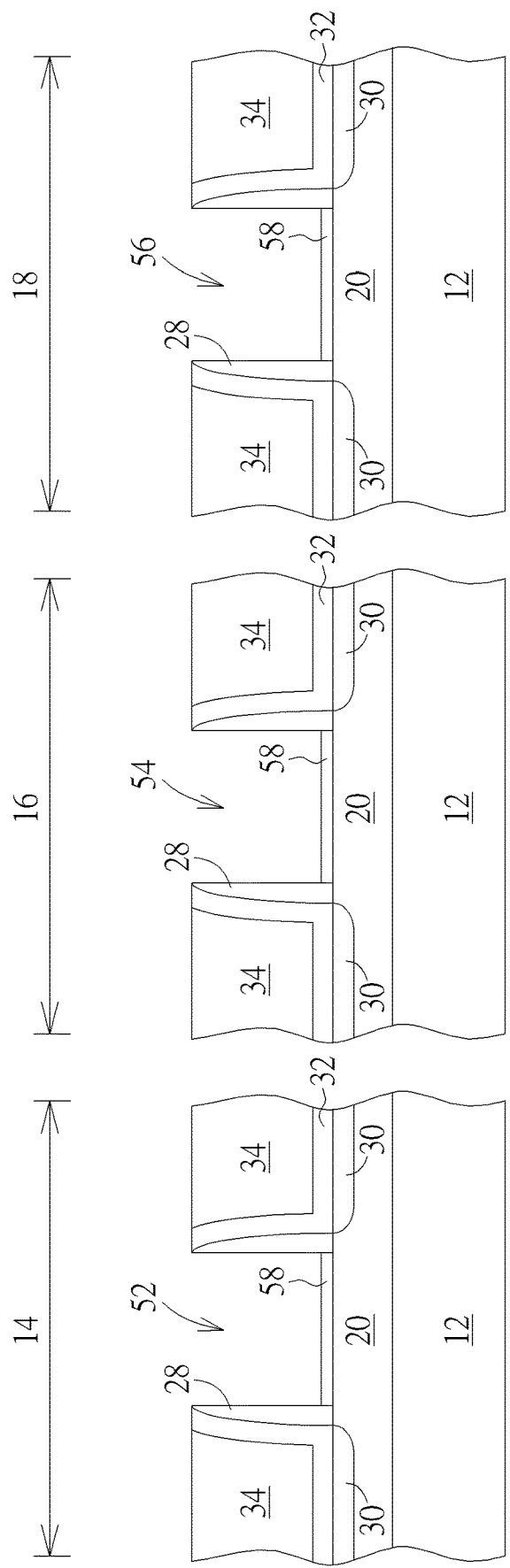

Next, as shown in FIG. 4, an interfacial layer 58 is formed in each of the recesses 52, 54, 56, in which the interfacial layer 58 preferably includes silicon oxide and the interfacial layer 58 formed in each of the recesses 52, 54, 56 preferably share equal thickness including but not limited to for example 5-10 Angstroms.

Figure 5:
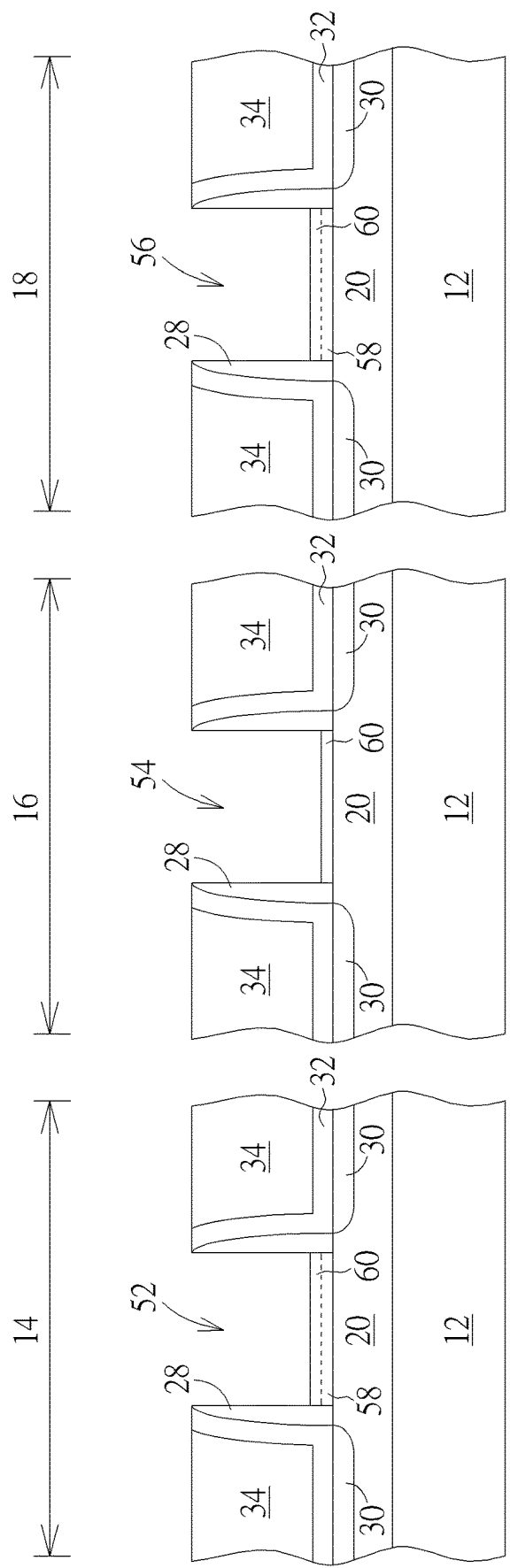

Next, as shown in FIG. 5, a patterned mask (not shown) is formed on the regions 14, 18, an etching process is conducted by using the patterned mask as mask to remove the interfacial layer 58 in the recess 54, the patterned mask is stripped, and an interfacial layer 60 is formed in the recesses 52, 54, 56. It should be noted that two interfacial layers 58, 60 are formed in the recesses 52, 56 while only a single interfacial layer 60 is formed in the recess 54, the total thickness of the interfacial layer within each of the recesses 52, 56 is greater than or more specifically about twice the total thickness of the interfacial layer in the recess 54 at this stage.

Figure 6:
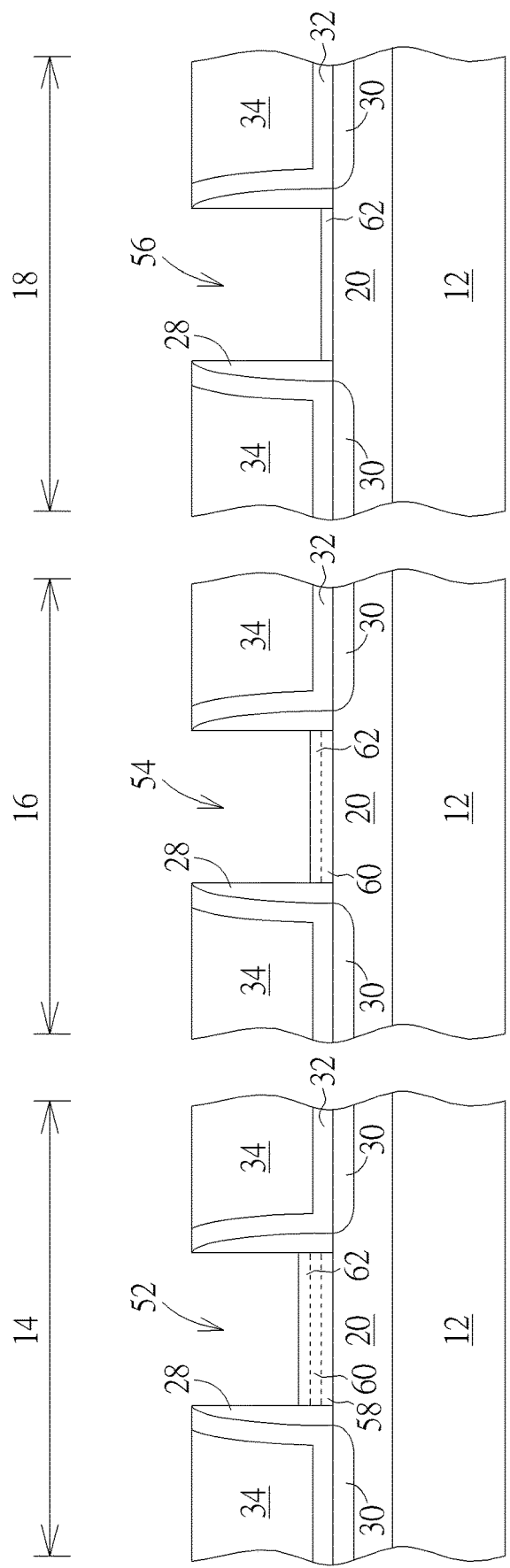

Next, as shown in FIG. 6, another patterned mask (not shown) is formed to cover the regions 14, 16, and an etching process is conducted by using the patterned mask as mask to remove all of the interfacial layers including interfacial layers 60, 58 in the recess 56. After stripping the patterned mask, another interfacial layer 62 is formed in each of the three recesses 52, 54, 56, in which the interfacial layers 58, 60, 62 are preferably made of same material such as silicon oxide. At this stage, a total of three interfacial layers 58, 60, 62 are stacked in the recess 52 on region 14, a total of two interfacial layers 60, 62 are stacked in the recess 54 on region 16, and only one interfacial layer 62 is formed in the recess 56 on region 18. Preferably, each of the interfacial layers 58, 60, 62 share same thickness such that the total thickness of interfacial layers in the recess 52 is preferably greater than the total thickness of interfacial layers in the recess 54 and the total thickness of interfacial layers in the recess 54 is further greater than the total thickness of interfacial layers in the recess 56. In this embodiment, the total thickness of interfacial layers in the recess 52 is approximately between 30-60 Angstroms, the total thickness of interfacial layers in the recess 54 is approximately between 10-20 Angstroms, and the total thickness of interfacial layers in the recess 56 is approximately between 5-10 Angstroms.

Figure 7:
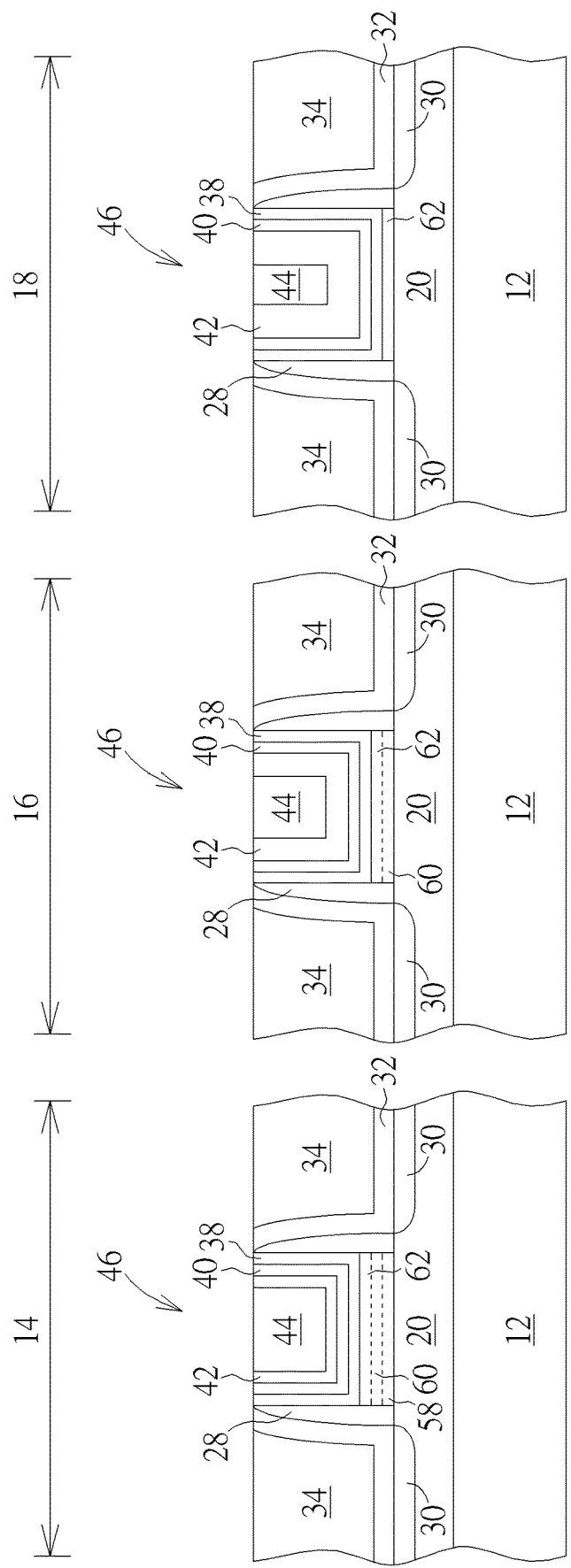

Next, as shown in FIG. 7, a high-k dielectric layer 38, a selective bottom barrier metal (BBM) layer 40, a work function metal layer 42, and a low resistance metal layer 44 are sequentially formed in the recesses 52, 54, 56, and a planarizing process, such as CMP is conducted to remove part of the low resistance metal layer 44, part of the work function metal layer 42, part of the BBM layer 40, and part of the high-k dielectric layer 38 to form metal gates 46 on the regions 14, 16, 18.

It should be noted that in addition to forming interfacial layers with different thicknesses on the regions 14, 16, 18 in the aforementioned embodiment, it would also be desirable to form work function metal layers 42 having different work functions on the regions 14, 16, 18, in which the definition of different work functions could include work function metal layers 42 having different materials and/or different thicknesses and when the work function metal layers 42 having different thicknesses, the definition of different thicknesses could include one thickness greater than or less than the other. For instance, the three interfacial layers 58, 60, 62 on region 14 could be paired with a work function metal layer 42 having a first work function, the interfacial layers 60, 62 on region 16 could be paired with a work function metal layer 42 having a second work function, and the interfacial layer 62 on region 18 could be paired with a work function metal layer 42 having a third work function, in which the first work function could be different from the second work function while either one of the first work function and second work function could be same as the third work function, or the first work function, second work function, and the third work function could all be different.

In this embodiment, the formation of work function metal layer 42 having different work functions such as different material or different thickness on regions 14, 16, 18 could be accomplished by depositing a work function metal layer into the recesses 52, 54, 56 and then removing part of the work function metal layer on particular region to adjust the overall thickness of the work function metal layer. For instance, it would be desirable to first deposit a work function metal layer into the recess 52, 54, 56 on the regions 14, 16, 18, form a patterned mask such as a patterned resist on region 18, and then remove part of the work function metal layer 42 on regions 14 and 16 not covered by the patterned resist so that the overall thickness of work function metal layer 42 on region 18 is greater than the thickness of work function metal layer 42 on each of the regions 14 and 16. Next, another patterned resist could be formed on regions 16 and 18, and another etching process could be conducted to remove part of the work function metal layer 42 on region 14. This produces a work function metal layer having three different thicknesses, in which the thickness of work function metal layer 42 on region 18 is greater than the thickness of work function metal layer 42 on region 16 while the thickness of work function metal layer 42 on region 16 is further greater than the thickness of work function metal layer 42 on region 14.

In this embodiment, the high-k dielectric layer 38 is preferably selected from dielectric materials having dielectric constant (k value) larger than 4. For instance, the high-k dielectric layer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. Preferably, the BBM layer 40 is selected from the group consisting of TiN and TaN, but not limited thereto.

In this embodiment, the work function metal layer 42 is formed for tuning the work function of the later formed metal gates to be appropriate in an NMOS or a PMOS. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof.

Next, part of the high-k dielectric layer 38, part of the BBM layer 40, part of the work function metal layer 42, and part of the low resistance metal layer 44 could be removed to form a recess (not shown), and a hard mask (not shown) could be formed in the recess so that the top surfaces of the hard mask and ILD layer 34 are coplanar. The hard mask could be selected from the group consisting of silicon oxide, silicon nitride, silicon oxynitride, and silicon carbon nitride.

Figure 8:
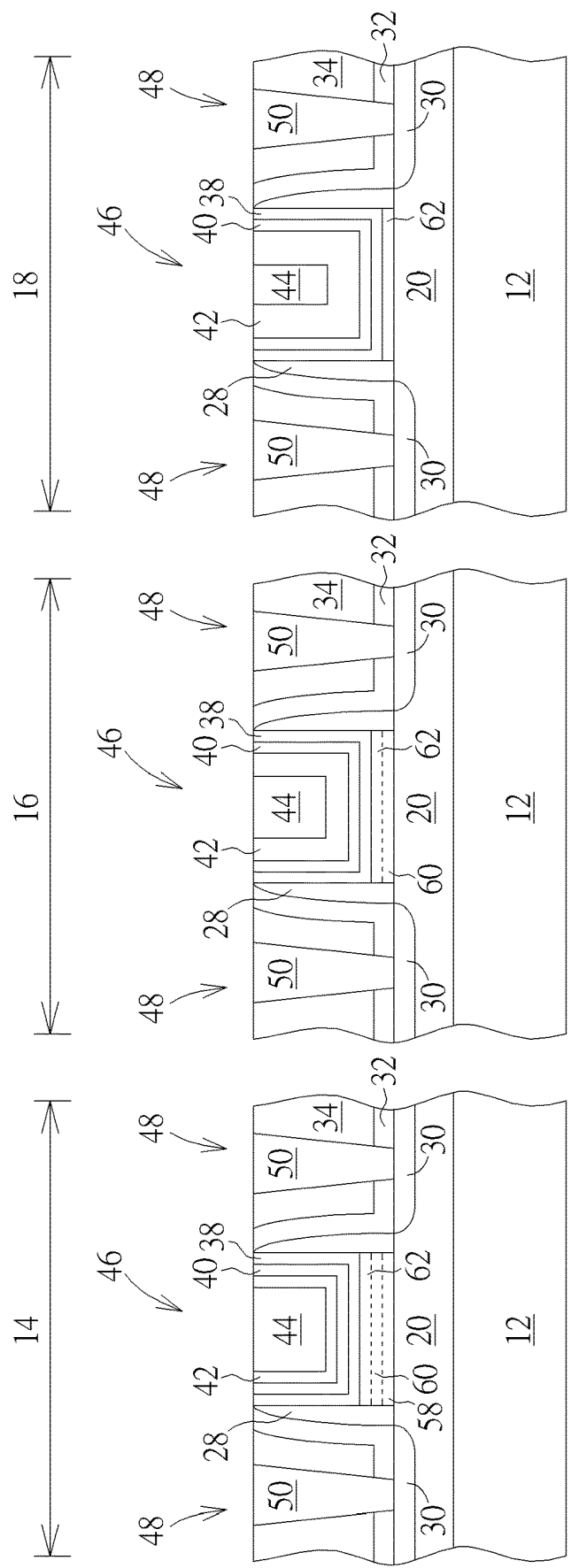

Next, as shown in FIG. 8, a contact plug formation could be conducted to form contact plugs 48 electrically connected to the source/drain regions 30. In this embodiment, the formation of contact plugs 48 could be accomplished by removing part of the ILD layer 34 and part of the CESL 32 to form contact holes (not shown), and then depositing a barrier layer (not shown) and a metal layer 50 into the contact holes. A planarizing process, such as CMP is then conducted to remove part of the metal layer 50, part of the barrier layer, and even part of the ILD layer 34 to form contact plugs 48, in which the top surface of the contact plugs 48 is even with the top surface of the ILD layer 34. In this embodiment, the barrier layer is selected from the group consisting of Ti, Ta, TiN, TaN, and WN, and the metal layer 50 is selected from the group consisting of Al, Ti, Ta, W, Nb, Mo, and Cu.

Figure 9:
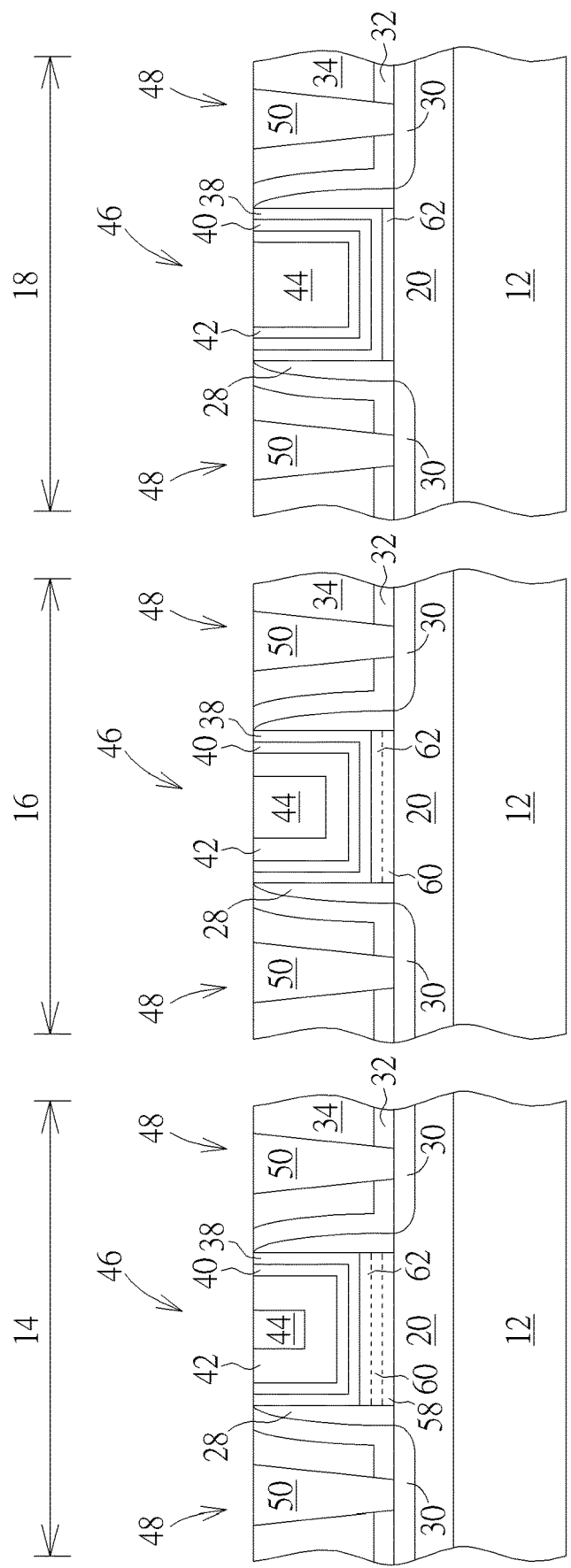
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, when the thickness of the total interfacial layer on region 14 is different from the thickness of the total interfacial layer on region 16 and the thickness of the total interfacial layer on region 16 is different from the thickness of the total interfacial layer on region 18, the work function metal layer 42 on region 14 and the work function metal layer 42 on region 16 could have different work functions as the work function metal layer 42 on either regions 14 or 16 and the work function metal layer 42 on region 18 could also have different work functions. In other words, the first work function, the second work function, and the third work function could all be different and the definition of different work function could include work function metal layers 42 having different materials and/or different thicknesses and when the work function metal layers 42 having different thicknesses, the definition of different thicknesses could include one thickness greater than or less than the other.

For instance, in contrast to pairing interfacial layers 58, 60, 62 having the maximum thickness with work function metal layer 42 having minimum thickness on region 14, pairing interfacial layers 60, 62 having medium thickness with work function metal layer 42 having medium thickness on region 16, and pairing interfacial layers 62 having minimum thickness with work function metal layer 42 having maximum thickness on region 18 in the aforementioned embodiment, it would also be desirable to maintain the thickness of total interfacial layers on each regions 14, 16, 18 while changing the thickness of its pairing work function metal layer 42 in any manner. For instance, it would be desirable to pair the interfacial layers 58, 60, 62 having the maximum thickness with a work function metal layer 42 having maximum thickness on region 14, pairing interfacial layers 60, 62 having medium thickness with work function metal layer 42 having medium thickness on region 16, and pairing interfacial layer 62 having minimum thickness with work function metal layer 42 having minimum thickness on region 18, which is also within the scope of the present invention.

Typically, device regions including input/output region (such as the aforementioned region 14) and core region (such as the aforementioned region 18) in current semiconductor device are largely affected by the predetermined thickness of interfacial layer. For instance, thicker interfacial layer in input/output region easily lowers the operation speed of the device while thinner interfacial layer in core region would often result in severe leakage. To resolve this issue the present invention preferably defines a middle gate region (such as the aforementioned region 16) between the input/output region and the core region and keeps the total thickness of interfacial layer in this region 16 between the total thickness of interfacial layer in the input/output region and the total thickness of interfacial layer in the core region so that a more balanced voltage output could be obtained. Moreover, it would also be desirable to adjust the work function of work function metal layers in each of the above regions 14, 16, 18 in addition to adjusting the thickness of interfacial layers for producing different threshold voltage output combinations, in which the tuning of work function could be accomplished by adjusting the material and/or thickness of the work function metal layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region, a second region, and a third region, wherein the first region comprises an input/output region, the second region comprises a middle gate region, and the third region comprises a core region;
   forming a first gate structure on the first region, a second gate structure on the second region, and a third gate structure on the third region;
   forming an interlayer dielectric (ILD) layer around the first gate structure, the second gate structure, and the third gate structure;
   removing the first gate structure, the second gate structure, and the third gate structure to form a first recess, a second recess, and a third recess;
   forming a first interfacial layer in the first recess, the second recess, and the third recess after removing the first gate structure, the second gate structure, and the third gate structure;
   removing the first interfacial layer in the second recess after forming the first interfacial layer in the first recess, the second recess, and the third recess;
   forming a second interfacial layer in the first recess, the second recess, and the third recess;
   removing the first interfacial layer and the second interfacial layer in the third recess;
   forming a third interfacial layer in first recess, the second recess, and the third recess; and
   forming a high-k dielectric layer on the third interfacial layer.

2. The method of claim 1, wherein the second interfacial layer and the third interfacial layer comprise same material.

3. The method of claim 1, further comprising:
   forming a first work function metal (WFM) layer in the first recess;
   forming a second WFM layer in the second recess;
   forming a third WFM layer in the third recess; and
   forming a low resistance metal layer on the first WFM layer, the second WFM layer, and the third WFM layer.

4. The method of claim 3, wherein the first WFM layer, the second WFM layer, and the third WFM layer comprise different work functions.

5. The method of claim 4, wherein the first WFM layer, the second WFM layer, and the third WFM layer comprise different materials.

6. The method of claim 4, wherein the first WFM layer, the second WFM layer, and the third WFM layer comprise different thicknesses.

7. The method of claim 1, wherein the first interfacial layer and the second interfacial layer comprise same material.

8. A semiconductor device, comprising:
   a substrate having a first region, a second region, and a third region;
   a first metal gate on the first region, wherein the first metal gate comprises:
      a first interfacial layer;
      a high-k dielectric layer on the first interfacial layer; and
      a first work function metal (WFM) layer on the high-k dielectric layer;
   a second metal gate on the second region, wherein the second metal gate comprises:
      the first interfacial layer;
      a second interfacial layer on the first interfacial layer;
      the high-k dielectric layer on the second interfacial layer; and
      a second WFM layer on the high-k dielectric layer, wherein the first WFM layer and the second WFM layer comprise different work functions, each of the first interfacial layer and the second interfacial layer is a single-layered structure, a bottom surface of the first interfacial layer on the first region is even with a bottom surface of the first interfacial layer on the second region, and a thickness of the first interfacial layer on the first region directly contacting the substrate and the high-k dielectric layer and a thickness of the first interfacial layer and the second interfacial layer on the second region directly contacting the substrate and the high-k dielectric layer are different.

9. The semiconductor device of claim 8, further comprising a third metal gate on the third region, wherein the third metal gate comprises:
   the first interfacial layer;
   the second interfacial layer on the first interfacial layer;
   a third interfacial layer on the second interfacial layer; and
   a third WFM layer on the third interfacial layer.

10. The semiconductor device of claim 9, wherein the first WFM layer, the second WFM layer, and the third WFM layer comprise different work functions.

11. The semiconductor device of claim 10, wherein the first WFM layer, the second WFM layer, and the third WFM layer comprise different materials.

12. The semiconductor device of claim 10, wherein the first WFM layer, the second WFM layer, and the third WFM layer comprise different thicknesses.

13. The semiconductor device of claim 8, wherein the first WFM layer and the second WFM layer comprise different work functions.

14. The semiconductor device of claim 13, wherein the first WFM layer and the second WFM layer comprise different materials.

15. The semiconductor device of claim 13, wherein the first WFM layer and the second WFM layer comprise different thicknesses.

* * * * *